United States Patent
Hofmeister (12) United States Patent (10) Patent No.: US 10,090,747 B2
(45) Date of Patent: Oct. 2, 2018

(54) ELECTRIC MOTOR AND ELECTRIC CIRCUIT

(71) Applicant: Ellenberger & Poensgen GmbH, Altdorf (DE)

(72) Inventor: Lothar Hofmeister, Neumarkt (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 185 days.

(21) Appl. No.: 15/149,521

(22) Filed: May 9, 2016

(65) Prior Publication Data

US 2016/0329799 A1    Nov. 10, 2016

(30) Foreign Application Priority Data

May 7, 2015    (DE) .................. 10 2015 208 543

(51) Int. Cl.
| | |
|---|---|
| *H02K 41/02* | (2006.01) |
| *H02K 33/16* | (2006.01) |
| *H02K 41/035* | (2006.01) |
| *H02K 7/116* | (2006.01) |
| *H02K 11/33* | (2016.01) |
| *H01H 3/42* | (2006.01) |
| *H02K 7/00* | (2006.01) |
| *H05K 1/18* | (2006.01) |

(52) U.S. Cl.
CPC ............. *H02K 41/02* (2013.01); *H01H 3/42* (2013.01); *H02K 7/003* (2013.01); *H02K 7/116* (2013.01); *H02K 11/33* (2016.01); *H02K 33/16* (2013.01); *H02K 41/0352* (2013.01); *H05K 1/181* (2013.01); *H05K 2201/1009* (2013.01)

(58) Field of Classification Search
CPC . H01H 3/42; H02K 11/33; H02K 7/00; H02K 7/003; H02K 41/02; H02K 33/16; H02K 41/0352; H02K 7/116; H05K 1/18; H05K 1/181; H05K 2201/1009
USPC ........................................................ 310/68 B
See application file for complete search history.

(56) References Cited

U.S. PATENT DOCUMENTS

| | | | |
|---|---|---|---|
| 4,050,331 A | 9/1977 | Braren | |
| 4,864,199 A * | 9/1989 | Dixon | .................... H02K 29/06 318/400.09 |
| 4,914,330 A | 4/1990 | Pierrat | |
| 5,448,117 A | 9/1995 | Elliott | |
| 6,051,902 A * | 4/2000 | Ogino | .................... H02K 21/44 310/154.01 |
| 6,234,938 B1 * | 5/2001 | Chen | ................ A63B 21/00192 188/161 |
| 6,392,322 B1 * | 5/2002 | Mares | ...................... B23Q 5/58 310/12.04 |

(Continued)

FOREIGN PATENT DOCUMENTS

| | | |
|---|---|---|
| DE | 100 28 964 A1 | 1/2002 |
| DE | 10 2009 053 727 A1 | 5/2011 |

(Continued)

*Primary Examiner* — Naishadh Desai

(74) *Attorney, Agent, or Firm* — Muncy, Geissler, Olds & Lowe, P.C.

(57) ABSTRACT

An electric motor, in particular a printed circuit board, having a stator, and a linearly guided rotor. On the rotor, a bolt ring having a number of bolts is attached. A cycloidal disc is connected in engagement to the bolt ring. An electrical circuit is also provided having a printed circuit board and an electric motor which is attached to the circuit board.

20 Claims, 3 Drawing Sheets

(56) References Cited

U.S. PATENT DOCUMENTS

| | | | |
|---|---|---|---|
| 2004/0119366 A1* | 6/2004 | Hosaka | H02K 1/2753 |
| | | | 310/49.01 |
| 2009/0133518 A1 | 5/2009 | Kawamoto | |
| 2010/0289359 A1* | 11/2010 | Knaian | H02K 21/04 |
| | | | 310/83 |
| 2010/0300480 A1* | 12/2010 | Pilcher | H02K 33/16 |
| | | | 132/320 |
| 2012/0300088 A1 | 11/2012 | Terajima | |
| 2013/0342054 A1* | 12/2013 | Long | H02K 21/24 |
| | | | 310/71 |
| 2014/0111045 A1 | 4/2014 | Goepel | |
| 2014/0265988 A1* | 9/2014 | Lee | H02K 11/33 |
| | | | 318/495 |
| 2015/0015124 A1* | 1/2015 | Rajasingham | H02K 21/24 |
| | | | 310/60 A |
| 2015/0028699 A1* | 1/2015 | Hofstetter | H02K 41/031 |
| | | | 310/12.31 |

FOREIGN PATENT DOCUMENTS

| | | | | |
|---|---|---|---|---|
| EP | 0 746 085 A1 | 12/1996 | | |
| KR | 2668042 A1 * | 1/2010 | | H02K 5/225 |
| WO | WO 2012/156079 A2 | 11/2012 | | |

\* cited by examiner

ELECTRIC MOTOR AND ELECTRIC CIRCUIT

This nonprovisional application claims priority under 35 U.S.C. § 119(a) to German Patent Application No. 10 2015 208 543.0, which was filed in Germany on May 7, 2015, and which is herein incorporated by reference.

BACKGROUND OF THE INVENTION

Field of the Invention

The present invention relates to an electric motor with a stator and a rotor. In particular, the electric motor is suitable for attachment to a circuit board. The invention further relates to an electrical circuit with a circuit board and an electric motor connected to the circuit board.

Description of the Background Art

Switching modules are usually constructed in the manner of a relay and usually have a switch which is moved by means of an actuator. For this purpose, an electromagnet is used, which with suitable energization moves a switch from an open to a closed position. Reopening is ensured by means of a mechanical spring. In order for an opening always to be guaranteed during a hooking or a welding of the contacts in the closed position, it is necessary to select a spring with a relatively high spring force. Consequently, it is necessary to choose a comparatively powerful electromagnet, so that the switch can be brought into the closed position during normal operation. This requires a relatively large installation space of the switching module and a comparatively high power consumption.

Unless a rapid switching between the two positions is required, or as long as different switching stages need to be assumed by the switch, an electric motor can be used. This drives a spindle or the like, by means of which the rotational motion of the electric motor is converted into a transverse movement which adjusts the switch. In order to exert high forces with the electric motor, a relatively high electric current is required for the operation of the electric motor, which leads to an increased burden during energization. Alternatively, an electric motor with a comparatively low electrical current, but operated at an increased speed, is used. It is hereby necessary to reduce the rotational speed by means of reduction gear to a manageable speed for further components of the switch, such as the spindle or the like, which thus also increases the applied torque. Due to the comparatively high speed of the electric motor, the friction is increased. Also required are a comparatively precise bearing and the reduction gear, which in turn increases the installation space.

From DE 10 2009 053 727 A1, a cycloidal drive for the undercarriage of automobiles is known. Here, a swash plate eccentrically mounted around a central axis circulates a stator arranged within the swash plate. By means of the stator, an eccentric rotary motion of the swash plate is caused when current is supplied, said swash plate meshing with an outer support ring.

SUMMARY OF THE INVENTION

It is therefore an object of the invention to provide an electric motor and an electrical circuit, wherein in particular installation space is reduced, and wherein production costs are advantageously reduced.

In an exemplary embodiment, the electric motor has a stator and a rotor. The stator is hereby expediently fixed during operation relative to a component driven by the electric motor. The rotor, however, is guided linearly, relative to the stator. In other words, the rotor is moved linearly during operation, relative to the stator, i.e. transversely. Particularly preferred, the rotor is moved planar during operation, relative to the stator, i.e. in a plane perpendicular to the desired rotation. Advantageously, the rotor is mounted transversely, for example, planar. In particular, the rotor itself is not rotatably mounted. Advantageously, a rotation of the rotor is not provided with respect to the stator and is expediently suppressed. In other words, the rotor is held in rotation. However, at least one full revolution of the rotor relative to the stator is prevented. Suitably, a rotation of the rotor relative to the stator is prevented by an angle greater than 90°, 45°, 30°, 20°, 10°, 5° or 2°. In other words, a pendulum movement of the rotor relative to the stator is provided by in each case a maximum of 1°. If a larger maximum angle is chosen, the pendulum motion consequently has a greater amplitude.

A bolt ring with a number of bolts is attached at the rotor. The bolts are in particular each designed cylindrically and are arranged in a ring. In particular, the individual bolts are parallel to each other and/or end within the same plane. Expediently, the profile of the bolts is perpendicular to the plane within which the rotor is moved transversely. The ring formed by the bolts is advantageously in the plane, or at least parallel to the plane within which the rotor is moved transversely. The bolts are connected to the rotor, so that these are also linearly moved relative to the stator during operation of the electric motor. The bolt ring formed by the bolts is expediently round, in particular circular. At least, however, in each case a corner of an advantageously symmetrical polygon is formed by the bolts, wherein all the edges of this polygon are the same length and the corners lie on a common circle.

The electric motor further includes a cycloidal disc which is advantageously supported rotatably, for example by means of a ball bearing or a sliding bearing. For example, a shaft is connected to the cycloidal disc, by means of which a component can be driven during operation of the electric motor. In particular, the bolts of the bolt ring are arranged parallel to the shaft. The bolt ring is connected to the cycloidal disc in engagement. In other words, the bolt ring meshes with the cycloidal disc during operation of the electric motor. In particular, the bolt ring is at least partially in direct mechanical contact with the cycloidal disc. The cycloidal disc, for example, is a cam disc with a number of curved sections, wherein the number of cam portions advantageously differs from the number of bolts. In particular, the curved sections are formed by rounded teeth or the like. For example, the number of curved sections is greater than the number of bolts. Preferably, the cycloidal disc has a wave-shaped, in particular virtually sine-shaped edge for forming the curve sections, wherein by means of each period of the sine or the wave, one of the curved sections or one of the teeth is formed. The diameter of the bolt ring is different from the diameter of the cycloidal disc, in particular from the area of the cycloidal disc which is formed by means of the curved sections.

During operation of the electric motor, the rotor is moved transversely by means of the stator, resulting in a transverse movement of the bolt ring. As a result, the engagement of a part of the bolt ring with the cycloidal disc is released and an engagement with another portion of the bolt ring with the cycloidal disc is created. In other words, the bolt ring meshes with the cycloidal disc, resulting in a rotational movement of the cycloidal disc and advantageously, of the shaft bonded thereon, provided one exists. The center of the bolt ring is advantageously moved around the axis of the shaft, in particular along a circular path. In other words, during operation of the electric motor, the center of the bolt ring is at least temporarily at a distance from the axis, about which the cycloidal disc is rotated by the shaft.

Due to the transversally run rotor, the overall height of the electric motor is reduced in the axial direction. Thus, the shaft of the rotor doe not need to be supported. Also, due to the cycloidal disc, the creation of a reduction is provided, so that by means of the electric motor a comparatively high torque is applied. For this, no further drive is required. The electric motor has a comparatively small number of components, so that on the one hand the time of manufacture and on the other hand the manufacturing cost is reduced. Also, due to the transverse guide when hooking the bolt ring with the cycloidal disc, an automatic release by means of suitable movement of the rotor is provided. Because of the rotor and the bolt ring, no eccentric is required for operating the electric motor. In particular, the electric motor is configured without an eccentric.

For example, the electric motor is provided and in particular arranged to be mounted on a circuit board. Suitably, the cross-section of the rotor in a plane is rectangular and perpendicular to the profile of the bolt of the bolt ring, wherein the edge length is between 4 cm and 10 cm. Suitably, one of the edge lengths equals 6 cm. Advantageously, the cross-section is square. The extension in the axial direction, i.e. parallel to the extension direction of the bolts, is preferably less than 2 cm, 1.5 cm or 1 cm and/or greater than 4 mm, 5 mm or 6 mm. Particularly preferred, the size of the electric motor is greater than or equal to 40 mm×40 mm×4 mm and/or less than or equal to 100 mm×100 mm×20 mm, wherein the axial extent is between 4 mm and 20 mm. For example, the electric motor is a component of an in particular circuit board-based driving module, switching module, control module or evaluation module. Conveniently, a stepping motor is realized by means of the electric motor.

The cycloidal disc includes, for example, an attached cylindrical tube for receiving the shaft. In other words, the cycloidal disc has a flange which is designed for example as a hollow cylinder. The shaft is expediently arranged in sections inside the flange. In particular, a form fit between the shaft and the flange is created. For example, the shaft is flattened in the region of the flange, so that a rotational movement of the cycloidal disc leads to a rotational movement of the shaft, i.e. the shaft is carried along. A cam, for example, is attached on the shaft, by means of which during operation a micro switch is activated, which serves in particular to detect the position. Suitably, the flange, the cycloidal disc and/or the shaft have a position marker, in particular a recess, a magnet or a visual mark such as a line. The position marker is detected during operation by means of a suitable sensor and therefrom determines a position of the flange, the cycloidal disc or the shaft. In particular, the electric motor comprises a number of such position markers, advantageously a number of such lines, which are distributed at certain angular intervals, relative to the axis of the electric motor. Preferably, the angular distances between adjacent position markers are always the same size. By means of the position markers and the associated sensor, expediently an incremental encoder is realized. Preferably, the electric motor includes an incremental encoder.

The cycloidal disc or the shaft have on their circumference, for example, a recess for hooking, latching or linking, to enable these to be locked in one or more positions. The lock is released during operation in particular by means of another mechanism. Conveniently, the lock is axially spaced from the position marker, provided that one exists.

For example, the electric motor comprises a coupling, by means of which the shaft can be decoupled from the cycloidal disc. The coupling preferably comprises a further disc. The further disc and the cycloidal disc have the same axis of rotation. The other disc (shaft support disc) is axially moveable relative to the cycloidal disc for decoupling of the shaft from the cycloidal disc. In a power transmission from the cycloidal disc to shaft, the cycloidal disc and the other disc are preferably hooked. The other disc replaces, for example, the flange. In the case of a malfunction, such as an overcurrent, the cycloidal disc or the further disc, for example, is axially displaced, resulting in the uncoupling of the two discs. In particular, the further disc is loaded by means of a mechanical energy storage such as a spring, by means of which the other disc is pressed against the cycloidal disc. Alternatively, the shaft decoupled from the cycloidal disc by means of the mechanical energy accumulator is moved into a safe position, in particular reset, suitably if the electric motor or the component driven by the electric motor, such as the micro switch, provided one is available, is subjected to an overcurrent.

The cycloidal disc can have internal toothing. In other words, the teeth formed by means of the curved sections, i.e., the rounded portions, are disposed on an inner edge of the cycloidal disc. Consequently, the rounded portions point to the axis, about which the cycloidal disc rotates during operation. Preferably, the number of teeth is greater than 8 and/or advantageously less than 36, 31, 26 or 20. In particular, the cycloidal disc comprises 10 to 14, in particular 12 such teeth or curved sections. In this way, a relatively small installation space is realized. In particular, the cycloidal disc is shaped like a ring, wherein the inner boundary is formed by means of the curved sections. For example, the cycloidal disc comprises two part-discs, wherein the one is configured in the manner of a ring with the curved sections, and the other is configured in the manner of a cylinder. The two part-discs are hereby joined together in the axial direction. The shaft is preferably attached to the part-disc of the cycloidal disc which is designed like a cylinder, in particular integrally formed. The remaining part-disc expediently faces toward the rotor. For example, the cycloidal disc is configured in one piece, in particular integrally with the shaft. Preferably, the cycloidal disc is constructed of a plastic material, in particular by means of an injection molding process. In this way, manufacturing costs are reduced on the one hand. On the other hand, electrical insulation is hereby realized.

The bolt ring can be connected to a support, preferably attached thereto. In particular, the bolts are connected to the ends of the support, wherein expediently the remaining end of the bolts are spaced apart from the support, and are only optionally directly mechanically contacted with the cycloidal disc. The support is in turn connected to the rotor, for example, fastened thereto. Suitably, the rotor and the support are glued together, pressed or snapped, which reduces manufacturing costs. Due to the stabilization by means of the support, a relatively stable bolt ring is created. It is hereby not necessary to adapt the material of the support that is used to any potential electromagnetic characteristics of the rotor. In other words, a functional separation between the provision and stabilization of the bolt ring on the one hand, and the electromagnetic characteristics necessary for the movement of the rotor on the other hand, is realized. Conveniently, the bolt ring is molded to the support. In other words, the individual bolts are integral with the support. In particular, the bolts are made of a plastic, expediently in an injection molding process. In this way, it is possible to separately manufacture the support with the bolt ring integrally formed thereon from other components of the electric motor, which further reduces manufacturing costs. For example, the support is produced from a metal, in particular non-magnetic metal, in particular copper or brass.

For example, the rotor can have a number of permanent magnets, which increases the efficiency of the electric motor. Particularly preferably, however, the electric motor has a soft-magnetic, in particular ferromagnetic, material, such as iron, for example, soft iron. In this manner, repeated magnetization of the rotor is possible. Also, possible demagnetization due to aging effects need not be considered, and manufacturing costs are further reduced. Suitably, the rotor is designed like a plate, expediently in the form of a regular polygon, for example, a triangle or square or a rectangle. In other words, the rotor has a triangular, rectangular, square or polygonal cross-section relative to the axis of the electric motor. In particular, the rotor is designed platelet-shaped, which further reduces the axial height. In particular, the axial extension of the rotor is less than or equal to 30%, 20%, 10%, 5%, 3% or 2% of the expansion in a direction perpendicular thereto. Preferably, the rotor comprises a central recess. In other words, the rotor is constructed in the manner of a frame. In particular, the shaft connected to the cycloidal disc is arranged within this central recess in the mounted state, or components of the electric motor for supporting the cycloidal disc are located within said recess. In this way, the installation space of the electric motor is further reduced.

Suitably, in the assembled state a part of the rotor at least temporarily bears against components of the stator. In particular, the rotor at least in sections bears against one of the rotor edges, such as an outer edge or an edge defining the maximum expansion of the rotor. In this way, in particular the transversal bearing of the rotor is realized. Suitably, this outer edge has a recess, so that it is designed serrated. In other words, this edge is externally toothed. The component of the electric motor used for the guidance of the rotor is advantageously located within this recess, which is formed by means the toothing. Consequently, a stop is formed by means of the individual teeth, so that the transverse movement of the rotor is limited. Preferably, two or three, in particular all outer edges of the rotor are designed serrated, so that even after a transverse movement in each case at least one of the outer edges of the rotor is in engagement with a component of the stator for the transverse guidance of the rotor, or at least bears against it.

For example, each bolt can be designed integrally, which reduces manufacturing costs. As an alternative to this, each bolt has a sliding sleeve within which a core of the bolt is arranged. To this end, the core is suitably connected to the support, in particular integrally formed, provided that one exists. By means of the core of the bolt, stability of the respective bolt is realized, wherein by means of the respective sliding sleeve, in particular designed as a hollow cylinder, a coefficient of friction is reduced between the bolt and the cycloidal disc. Due to the cycloidal disc, in this case a release of the sleeve is prevented by the bolt, so that a costly fastening of the sleeve to the respective core can be avoided. For example, the sleeve is formed of a metal or a plastic such as polytetrafluoroethylene (PTFE) or of a PTFE-coated plastic. In this way it is possible to increase the efficiency of the electric motor.

For example, the bolt ring comprises 7 or more bolts. In particular, the number of bolts is less than or equal to 35, 30, 25, 20 or 18. The bolt ring expediently comprises 8 to 15 bolts, for example, 11 bolts. Here, the cycloidal disc is further rotated by substantially 360°/(number of bolts+1) during a movement of the bolt ring along the complete cycle. Consequently, with such a number of bolts, a stepping motor with a precisely defined step length is provided, wherein the step length is comparatively low. Thus, a relatively precise positioning of the component driven by the electric motor is provided. Also, a relatively high torque is provided due to the selected reduction.

The stator can have two, in particular three, four, five or more electromagnets, by means of which during operation the rotor is moved transversely, that is, is moved in a linear direction. The electromagnets are particularly spaced apart and surround the rotor preferably circumferentially. The electromagnets are hereby suitably spaced from the rotor, provided they are not energized. When current is supplied, the rotor is preferably attracted by the electromagnet until it is at least partly in direct mechanical contact with the respective electromagnet. In this way, efficiency is increased on the one hand. On the other hand, an excessive movement of the rotor is prevented. For example, the end position of the rotor is determined by the position of the bolt ring in the cycloidal disc, i.e. by means of an insertion of the bolts in one of the curved sections of the cycloid curve. Conveniently, the electromagnets are distributed with rotational symmetry relative to the axis of the electric motor. For example, each electromagnet is arranged in parallel with one of the sides of the rotor, provided that the rotor is designed in the manner of a polygon.

The stator can comprise four electromagnets, provided that the rotor is configured rectangular. Conveniently, each edge is assigned one of the electromagnets. By means of the electromagnets, in particular also a rectangular shape is formed, which, however, includes a larger area than the rotor. The rotor is hereby linearly moveable within the boundary formed by means of the electromagnets. Suitably, each electromagnet has a coil support by means of which in particular an attachment to other components of the stator takes place. Expediently, the coil support is designed as a hollow cylinder. For example, the coil support is formed of a synthetic material. Each electromagnet comprises in particular a, for example, hollow cylindrical coil which is expediently wound from lacquered copper wire. For example, the coil support carries the coils. In other words, the coil support is embodied as a hollow cylinder, wherein the coil support is circumferentially wound with the coil. Preferably, each electromagnet comprises a core, which is in particular made of a soft magnetic material, in particular soft iron. The core is suitably arranged within the coil and preferably inside the coil support, which is in particular configured as a hollow cylinder. The core expediently protrudes over the respective coil in the axial direction. In this way, a mounting of the spool by means of the core on further components of the stator is provided. Due to the comparatively simple structure of the electromagnet, on the one hand the use of standardized components is possible. On the other hand, each electromagnet is relatively inexpensive to produce. Provided that the rotor has a toothed outer edge, so it is recessed at its outer edge, advantageously the electric motor lies within this recess. In this way, the installation space is further reduced.

The electric motor can comprise a delay circuit which is suitably configured analogously. By means of this delay circuit, at least one of the electromagnets is electrically contacted. The electrical delay circuit itself is preferably connected to a power source, which in particular provides an alternating current. One of the other electromagnets is advantageously directly electrically in contact with the power source, at least, however, a current flow is not time-delayed by the delay circuit. In this way, first a magnetic field is created by the electromagnet which is contacted directly to the power source. After the time, which is adjustable or has been adjusted by means of the delay circuit, is up, the electromagnet which is contacted with the power source by means of the delay circuit is energized, and consequently creates a magnetic field. Conveniently, the frequency of the alternating current and the time of the delay circuit are hereby adjusted such that only one of the electromagnets is energized at the same time. Alternatively, the time intervals of the current flow overlap, wherein the time intervals are preferably not congruent. In other words, the electromagnets are not supplied with current only at the same time. Consequently, a time-varying magnetic field is created by means of which with suitable positioning of the electromagnets, the rotor is linearly, in particular planarly, moved. Thus, by relatively simple means, an operation of the electric motor is provided. The rotational speed can be set by the delay circuit and/or a frequency of an alternating current source used for energizing. Provided that an equal rotation speed of the electric motor is always desired, the time offset realized by means of the delay circuit is constant, so that, as long as the circuit is constructed analogously, the cost is further reduced. In addition, due to the relatively small number of electrical components required, failure is relatively unlikely, such that a robust electric motor is made available.

In an alternative embodiment of the invention, the electric motor comprises a microprocessor. By means of the microprocessor, the energization of the electromagnets is controlled or regulated during operation. In this case, a current flow is set by means of the electric motor to the respective electromagnet. In particular, the microprocessor is signally coupled in each case with a semiconductor switch, by means of which a current flow between a current source and one of the electromagnets is adjustable. Due to the use of the microprocessor, a relatively precise movement of the rotor and consequently a comparatively precise rotary motion of the electric motor can be realized. It is also possible to adapt the rotary movement that is realized by means of the electric motor to the current requirements. In addition, a later adaptation to the installation conditions of the electric motor is provided.

The electrical circuit comprises a printed circuit board, which is made particularly from a glass fiber reinforced epoxy resin and a copper layer, by means of which conductor tracks are provided. Preferably, the circuit board is configured rectangular. The circuit board expediently has an edge length of less than 10 cm. The electrical circuit further comprises an electric motor. The electric motor is connected to the circuit board. For example, it is connected by means of clips to the circuit board. Alternatively, the electric motor is glued or soldered/welded to the printed circuit board. The electric motor has a stator and a linearly guided rotor. A bolt ring with a number of bolts is attached to the rotor. A cycloidal disc is connected in engagement with the bolt ring. If current is supplied from any electromagnets of the stator, the rotor and consequently the bolt ring are moved linearly, in particular planarly. Consequently, the cycloidal disc is rotationally moved due to the engagement.

The electric motor is expediently configured rectangular and in particular has an edge length between 4 cm and 8 cm, suitably 6 cm. In particular, the surface of the electric motor standing in direct mechanical contact with the printed circuit board has an edge length of between 5 cm and 7 cm, in particular 6 cm. The remaining edge is suitably less than 2 cm, and/or in particular greater than 0.5 cm. In particular, further electrical and/or electronic components are connected on the circuit board. Appropriately, a driving module, switching module, control module or evaluation module is provided via the electrical circuit. For example, the electrical circuit is part of a circuit breaker.

The electric motor can comprise a shaft on which, for example, a cam is connected, by means of which during operation a micro switch is actuated. The micro switch is used in particular for position detection or for actuating a function of the electrical circuit. Suitably, the flange, the cycloidal disc and/or the shaft have a position marker, in particular a recess, a magnet or a visual mark such as a line. The position marker is detected during operation by means of a suitable sensor and therefrom, a position of the flange, the cycloidal disc or the shaft is determined.

The electric circuit can comprise a further circuit board, wherein the electric motor is arranged between the two circuit boards and connected to these. Any electronic components for drive control are preferably mounted such on the two circuit boards that they are located in voids of the engine components.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
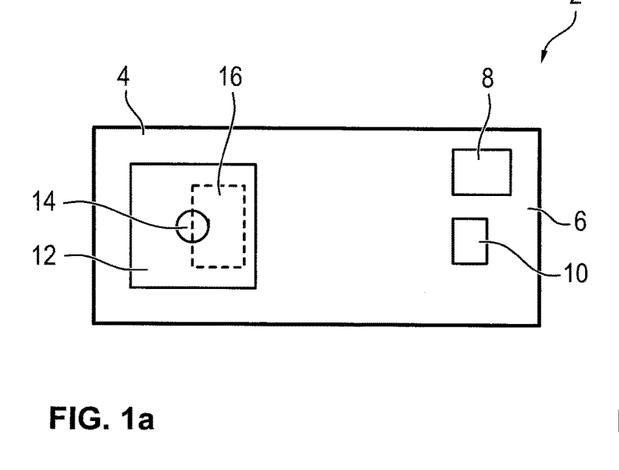
FIG. 1a is a top view of an electrical circuit having a printed circuit board and an electric motor.

FIG. 1a shows a switching module 2 of a circuit breaker in a schematically, simplified form. The switching module 2 comprises an electric circuit 4 with a printed circuit board 6 shown in a plan view. The circuit board 6 comprises a body made of glass fiber reinforced epoxy resin, to which not further shown conductor tracks made of copper are connected. With the circuit boards, electrical components 8 and electronic components 10 are electrically contacted. The electrical or electronic components 8, 10, only one of which is shown by way of example, are connected both electrically and mechanically by means of an SMD method to the circuit board 6.

On the circuit board 6, an electric motor 12 is fixed, having a substantially square base with an edge length of 6 cm. The electric motor 12 is designed rectangular, and on the opposite side of the circuit board 6, a shaft 14 protrudes from the cuboid housing of the electric motor 12. A spindle, not further shown, is driven by the shaft 14. The electric motor 12 includes a programmable microprocessor 16, which serves to control the rotational movement of the shaft 14.

Figure 1B:
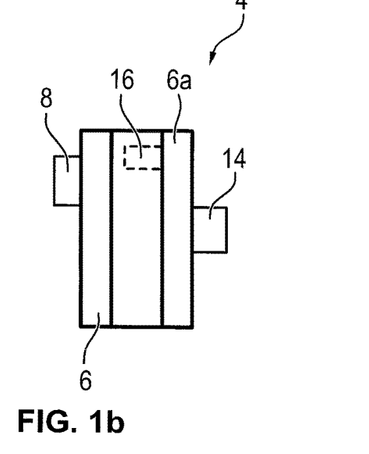
FIG. 1b is a side view of a further embodiment of the electrical circuit with the electric motor.

FIG. 1b shows a further embodiment of the electric circuit 4 with the electric motor 12 in a side view. The electric motor 12 is arranged between the circuit board 6 and a further circuit board 6a and is flush with these. The shaft 14 extends through the additional circuit board 6a and is for example provided with a cam for actuating a micro switch. The microprocessor 16 is positioned between the two printed circuit boards 6, 6a. In particular, the electrical or electronic components 8, 10 are also positioned between the two circuit boards 6, 6a, and are located in a recess of the electric motor 12. Alternatively, the electrical or electronic components 8, 10 are at least partially located on the side of the respective printed circuit board 6, 6a that is facing away from the electric motor 12.

Figure 2:
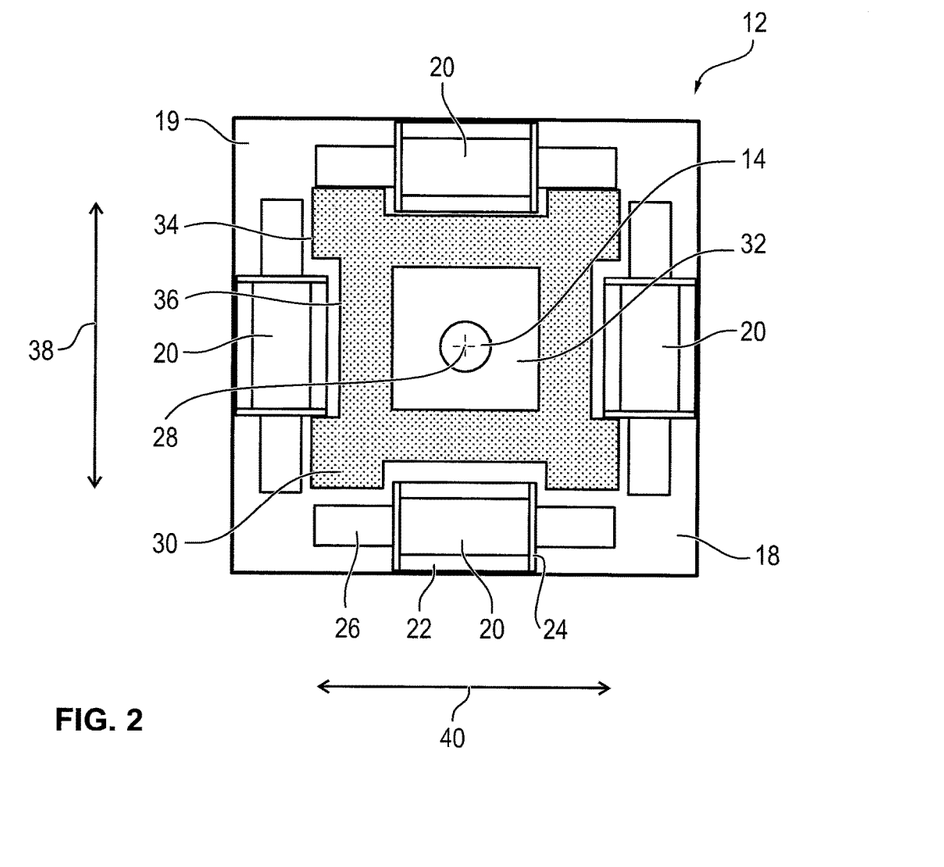
FIG. 2 illustrates sections of a plan view of a stator and a rotor of the electric motor.

FIG. 2 shows part of the electric motor 12 enlarged according to FIG. 1. The electric motor 12 comprises a base plate 18 of a stator 19 which is fixed to the circuit board 6. At the square base plate 18 made of a plastic, four electromagnets 20 are connected. According to the variant shown in FIG. 1b, the base plate 18 is realized by means of the circuit board 6 or the other circuit board 6a. Each of the electromagnets 20 comprises a coil 22 wound from a varnished copper wire, which is wound on a hollow cylindrical coil support 24 made of a plastic. Within each hollow cylindrical coil support 24, a core 26 of a soft magnetic material such as soft iron, is arranged. The core 26 protrudes in the axial direction over the respective coil support 24 on both sides. The core 26 and the coil support 24 are attached to the base plate. Each of the edges of the square base plate 18 is associated with one of the electromagnets 20 so that by means of the electromagnet 20, a rectangular shape is defined. The electromagnets 20 are arranged in rotational symmetry, relative to an axis 28 of the electric motor about which the shaft 14 rotates during operation.

Within the rectangular shape formed by means of the electromagnets 20, here in the manner of a square, a rotor 30 made of a soft iron is arranged. The rotor 30 is designed like a frame with a central, square recess 32. Within the recess 32, the shaft 14 is disposed, which runs perpendicular to the rotor 30. Each outer edge 34 of the frame-like rotor 30 has a recess 36, so that the outer edges 34 are serrated. The recess 36 is designed in the manner of a depression. Within each of these recesses 36, in each case the coil 22 of in each case one of the electromagnets 20 is partially disposed. The respective core 26 has a greater length than the respective recess 36. Consequently, the rotor 30 is guided by the electromagnets 20 linearly, planarly, in a first direction 38 and in a second direction 40. The first and second directions 38, 40 are hereby perpendicular to each other and in each case in parallel with the cores 26 of two of the electromagnets 20. By means of the cores 36 and the coil support 24, a linear movement of the rotor 30 is limited in the first or the second direction 38, 40. Due to the electromagnets 20, a rotational movement of the rotor 30 about the axis 28 is not possible.

Figure 3:
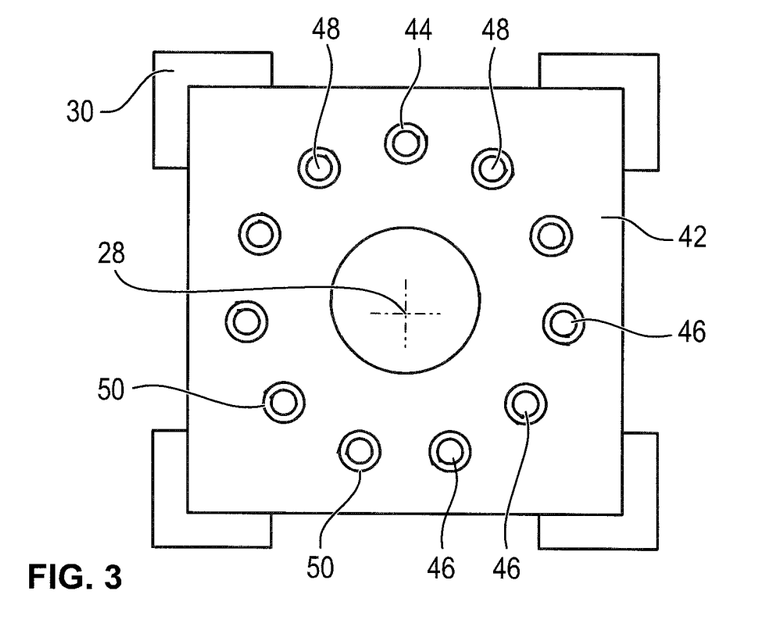
FIG. 3 illustrates a support with a bolt ring, mounted on the rotor.

FIG. 3 shows the rotor 30, on which a support 42 made of a plastic is connected. The support 42 is bonded to the rotor 30. The support 42 is configured square with a circular central recess, to which a bolt ring 44 is concentrically positioned. The bolt ring 44 includes eleven bolts 46 which are integrally formed on the support 42. The bolts 46 are arranged parallel to the axis 28. Each bolt 46 is cylindrically formed with a core 48, which is surrounded by a hollow cylindrical sliding sleeve 50 made of a PTFE-coated plastic.

Figure 4:
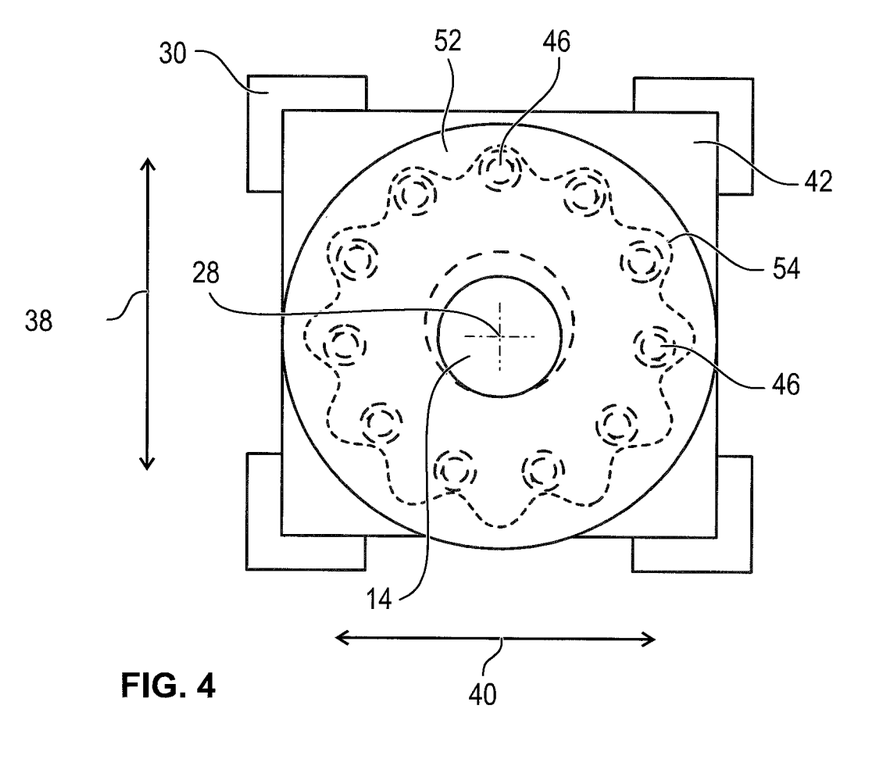
FIG. 4 illustrates a cycloidal disc in engagement with the bolt ring.

In FIG. 4, a cycloidal disc 52 is added in comparison to the composite shown in FIG. 3. At the rotatably mounted cycloidal disc 52, the shaft 14 is concentrically attached. The cycloidal disc 52 is aligned parallel to the support plate 42 and is recessed on the side facing away from the support 42, forming a number of indentations 54 which are shown here by means of concealed edges. By means of the indentations 54, curved sections are provided so that the cycloidal disc 52 is configured internally toothed. In other words, the curved sections, that is, the indentations 54, point in the axial direction 28 and circumferentially surround the bolt ring 42, which is also shown with concealed edges. Here, the edge provided by means of the indentations 54 has a larger diameter than the bolt ring 42. Consequently, some of the bolts 46 engage with the indentations 54, whereas further bolts 46 of the bolt ring 42 do not lie in the indentations 54 of the cycloidal disc 52.

The cycloidal disc 52 comprises twelve such indentations 54 or sinusoidal curve sections. In a transverse movement of the rotor 30, the bolt ring 42 is also moved to either the first and/or the second direction 38, 40, which releases the engagement of at least part of the bolt 46 with a part of the indentations 54, and provides an engagement of further bolts 46 with further indentations 54. Accordingly, the cycloidal disc 52 meshes with the bolt 42 when operating. Consequently, the cycloidal disc 52 is rotated about the axis 28 by a certain angle. In other words, a rotational movement of the cycloidal disc 52 about the axis 28 is created by means of a transverse movement of the rotor 30 in the first and/or second direction 38, 40. Consequently, the shaft 14 rotates and the spindle that is hereby mechanically connected, is driven. With the transverse movement of the rotor 30, the center of the bolt ring 42 is moved eccentrically, in the ideal case on a circle, around the axis 28. In one complete revolution of the center of the bolt ring 42 about the axis 28, the cycloidal disc 52 is rotated by 30 degrees, namely, 360°/(number of bolts 46+1). The energization of the electromagnets 20 takes place by means of the microprocessor 16, so that the electromagnets 20 can be energized either clockwise or counter-clockwise, successively in time or to a small extent overlapping in time.

Figure 5:
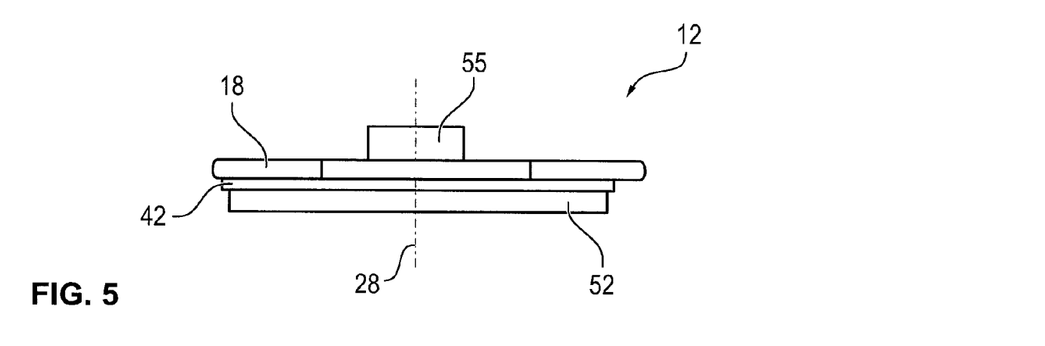
FIG. 5 is a side view of a detail of the electric motor.

FIG. 5 shows the electric motor 12 in sections in a side view. By means of the base plate 18, of the support 42 and of the cycloidal disc 52, a layered construction of the electric motor 12 is realized whose axial extent, i.e. the extension along the axis 28, is comparatively low as compared to the extension of the base plate 18. Also, a hollow cylindrical flange 55 is attached to the cycloidal disc 52 which extends through the recess 32 of the rotor 30 and of the base plate 18, and within which the shaft 14, not shown here, is located.

Figure 6:
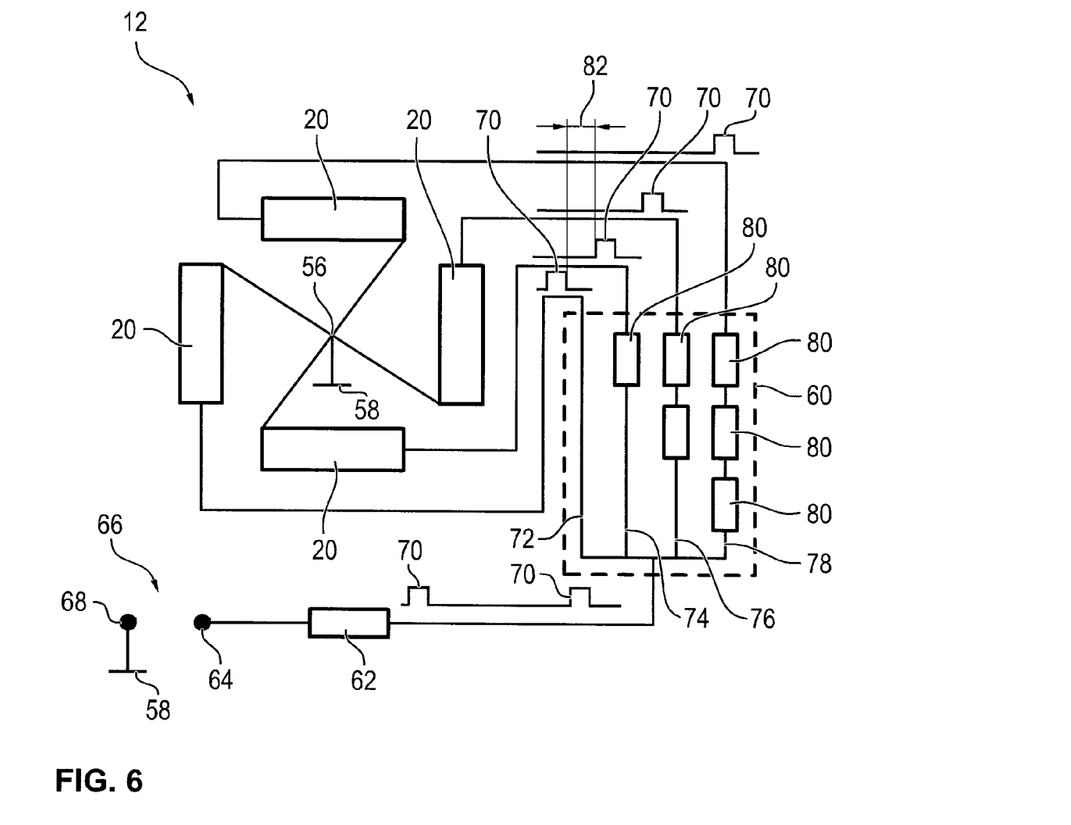
FIG. 6 illustrates an alternative driving of electromagnets of the stator.

FIG. 6 shows a schematically simplified further embodiment of the electric motor 12. Each of the electromagnets 20 is electrically contacted on one side with a star 56, which is guided to ground 58. The respective other terminal of the electromagnets 20 is guided to an analog delay circuit 60, which is guided via a chopper 62 against a pole 64 of a power source 66. The remaining pole 68 of the power source 66 is also guided to ground 58.

By means of the current source 66, a DC current is provided, which is subdivided into chronologically successive current pulses 70 by means of the chopper 62. Within the delay circuit 60, these are fed to a first branch 72, a second branch 74, a third branch 76 and a fourth branch 78, each of which is electrically contacted with in each case one of the electromagnets 20. The first branch 72 is formed only by means of a conductor, whereas the second branch 74 comprises a delay element 80. In this way, the current pulse 70 conducted by means of the second branch 74 is temporally delayed by a time interval 82 as compared to the current pulse 70 guided by means of the first branch 72.

The third branch 76 has two such delay elements 80, and the fourth branch 78 includes three such delay elements 80, which are respectively connected in series. As a result, the current pulses 70 conducted by means of the third and fourth branch 76, 78 are offset to the rear by a time that corresponds to the number of delay elements 80. Consequently, one of the electromagnets 20 is primarily and at the same time energized for creating the current pulse 70 and consequently, a magnetic field with this same electromagnet 20 is created. This electromagnet 20 is connected by means of the first branch 72 to the current source 66. Once the duration of the current pulse 70 is over, this magnetic field breaks down.

Subsequently, the electromagnet 20, which is connected by means of the second branch 74 to the current source 66, is energized, namely after the time interval 82. Here, energization also only lasts for the duration of the current pulse 70, and in turn, after the time interval 82, the electromagnet 20 which is electrically contacted with the third branch 76, is energized. Following this, after the time interval 82 the remaining electromagnet 20 is energized. In summary, the electromagnets 20 are energized sequentially in time in the clockwise direction. As a result, the rotor 30 is moved along the first or second direction 38, 40 respectively toward the energized electromagnet 20, and the center of the bolt ring 42 is moved about the axis 28, resulting in a rotational movement of the cycloidal disc 52.

The invention is not limited to the embodiments described above. Rather, other variations of the invention can be derived therefrom by those skilled in the art without departing from the scope of the invention. In particular, all individual features described below in relation to the individual embodiments can be combined in different ways with each other without departing from the scope of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electric motor, in particular a printed circuit board, the electric motor comprising:
   a stator;
   a linearly guided rotor to which a bolt ring with a plurality of bolts is connected; and
   a cycloidal disc connectable with the bolt ring, the bolt ring being disposed between the linearly guided rotor and the cycloidal disc.

2. The electric motor according to claim 1, wherein the cycloidal disc is internally serrated.

3. The electric motor according to claim 1, wherein the bolt ring is connected to a support, in particular integrally formed, which is attached to the rotor.

4. The electric motor according to claim 1, further comprising a frame-like rotor having a central recess, wherein at least one outer edge is in particular toothed.

5. The electric motor according to claim 1, wherein each bolt has a sliding sleeve.

6. The electric motor according to claim 1, wherein the bolt ring includes between 8 and 15 bolts.

7. The electric motor according to claim 1, wherein the stator comprises three or more electromagnets.

8. The electric motor according to claim 7, wherein at least one of the electromagnets is electrically contacted with a delay circuit.

9. The electric motor according to claim 7, further comprising a microprocessor for energizing the electromagnets.

10. An electrical circuit comprising a printed circuit board and an electric motor connected to the circuit board according to claim 1.

11. The electric motor according to claim 1, further comprising a support plate on which the bolt ring is formed.

12. The electric motor according to claim 11, wherein the cycloidal disc is arranged parallel to the support plate and is recessed on a side facing away from the support plate.

13. The electric motor according to claim 1, where the cycloidal disc comprises a plurality of indentations circumferentially surrounding the bolt ring.

14. The electric motor according to claim 13, wherein some of the plurality of bolts engage with the plurality of indentations and some of the plurality of bolts do not engage with the plurality of indentations.

15. The electric motor according to claim 1, further comprising a hollow flange attached to the cycloidal disc and extending through a recess in the linearly guided rotor.

16. The electric motor according to claim 1, wherein the linearly guided rotor comprises:
   a square frame having four outer edges;
   a recess formed in a center of the square frame; and
   an edge recess formed in each of the four outer edges.

17. The electric motor according to claim 16, further comprising a plurality of electromagnets, each of the plurality of electromagnets being partially disposed within the four outer edges.

18. The electric motor according to claim 1, wherein each of the plurality of bolts is cylindrically formed and comprises:
   a core; and
   a hollow sliding sleeve surrounding the core.

19. An electric motor, comprising:
   a linearly guided rotor;
   a bolt ring, with a plurality of bolts, connected to the linearly guided rotor; and
   a cycloidal disc connectable with the bolt ring, the bolt ring being disposed between the linearly guided rotor and the cycloidal disc.

20. A switching module, comprising:
   an electric circuit;
   an electric motor fixed on the electric circuit, the electric motor comprising:
      a linearly guided rotor;
      a bolt ring, with a plurality of bolts, connected to the linearly guided rotor; and
      a cycloidal disc connectable with the bolt ring, the bolt ring being disposed between the linearly guided rotor and the cycloidal disc.

* * * * *